(12) United States Patent
Hong et al.

(10) Patent No.: US 6,762,331 B2
(45) Date of Patent: Jul. 13, 2004

(54) SYNTHESIS OF ORGANIC NANOTUBES AND SYNTHESIS OF ULTRATHIN NANOWIRES USING SAME AS TEMPLATES

(75) Inventors: Byung Hee Hong, Kyungsangbuk-do (KR); Chi-Wan Lee, Kyungsanbuk-do (KR); Kwang Soo Kim, Seoul (KR)

(73) Assignee: Postech Foundation, Kyungsangbuk-do (KR)

(*) Notice: Subject to any disclaimer, the term of this patent is extended or adjusted under 35 U.S.C. 154(b) by 42 days.

(21) Appl. No.: 10/075,486

(22) Filed: Feb. 13, 2002

(65) Prior Publication Data

US 2002/0185368 A1 Dec. 12, 2002

(30) Foreign Application Priority Data

Jun. 7, 2001 (KR) ........................................ 2001-31659

(51) Int. Cl.[7] ........................... C07C 39/12; C07C 6/00; B21C 37/00

(52) U.S. Cl. .................... 568/732; 204/157.15; 428/606

(58) Field of Search .................... 568/732; 204/157.15; 428/606

(56) References Cited

U.S. PATENT DOCUMENTS 5,581,091 A * 12/1996 Moskovits et al. ............ 257/9
2002/0117659 A1 * 8/2002 Lieber et al. .................. 257/14

FOREIGN PATENT DOCUMENTS

JP       11-246551 A   *  9/1999

* cited by examiner

Primary Examiner—Edna Wong
(74) Attorney, Agent, or Firm—Anderson, Kill & Olick, P.C.

(57) ABSTRACT

The present invention discloses a method for synthesizing a calix[4]hydroquinone organic nanotube and a method for synthesizing an ultrathin, stable nanowire using said organic nanotube as a template.

8 Claims, 5 Drawing Sheets schematic view of nanotube side view    top view nanowire formed inside of the nano tube schematic view of nanotube top view side view nanowire formed inside of the nano tube

SYNTHESIS OF ORGANIC NANOTUBES AND SYNTHESIS OF ULTRATHIN NANOWIRES USING SAME AS TEMPLATES

FIELD OF THE INVENTION

The present invention relates to a method for synthesizing an organic nanotube and to a method for synthesizing an ultrafine nanowire using the organic nanotube as a template.

BACKGROUND OF THE INVENTION

The discovery of carbon nanotubes having unique structural and physicochemical properties has led to many attempts to develop various tubular inorganic and organic nanotubes [see "Y. Feldman et al., Science 267, 222(1995)"; "W. G. Orr et al., Science 285, 1049(1999)"; "A. Harada et al., Nature 364, 516(1993)"; and "M. R. Ghadiri et al., Nature 366, 324 (1993)".] For example, organic nanotubes, such as cyclic peptide nanotubes, lipid nanotubes and cyclodextrin nanotubes, have been prepared, but their industrial applicability is limited due to the lack of suitable electrochemical and photochemical properties.

SUMMARY OF THE INVENTION

Accordingly, it is an object of the present invention to provide a method for synthesizing an organic nanotube having excellent electrochemical and photochemical properties suitable for use as a template in synthesizing a single-crystalline nanowire.

In accordance with one aspect of the present invention, there is provided a method for synthesizing a calix[4]hydroquinone(CHQ) organic nanotube, which comprises dissolving CHQ in an aqueous acetone solution, and allowing acetone to evaporate off the resulting solution at a temperature ranging from 0 to 20 □ to effectuate CHQ crystallization into a self-assembled nanotube.

In another aspect of the present invention, there is provided a method for synthesizing a nanowire, which comprises adding the CHQ organic nanotube thus synthesized to an aqueous solution containing a metal salt to let the metal ion enter the cavity of the nanotube and allowing the CHQ moieties of the nanotube to reduce the metal ion into the form of a nanowire.

BRIEF DESCRIPTION OF THE DRAWINGS

The above and other objects and features of the present invention will become apparent from the following description of the invention taken in conjunction with the following accompanying drawings, which respectively show.

DETAILED DESCRIPTION OF THE INVENTION

Calix[4]hydroquinone(CHQ), an electrochemically and photochemically active macrocyclic molecule, is used as the starting material in the synthesis of the inventive organic nanowire. CHQ is a reduced form of calix[4]quinone(CQ), and the CQ/CHQ redox reaction is shown in scheme 1:

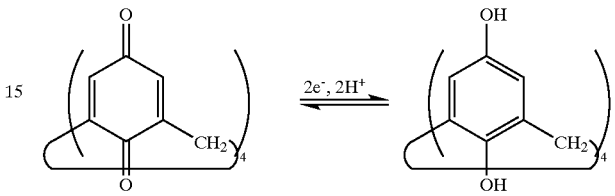

CHQ is dissolved in an aqueous acetone solution, and allowed to self-assemble into a nanotube bundle in the form of a stable needle-like crystal. In this process, a salt such as cesium sulfate ($Cs_2SO_4$) may be used as a crystallization promoter.

Figure 1:
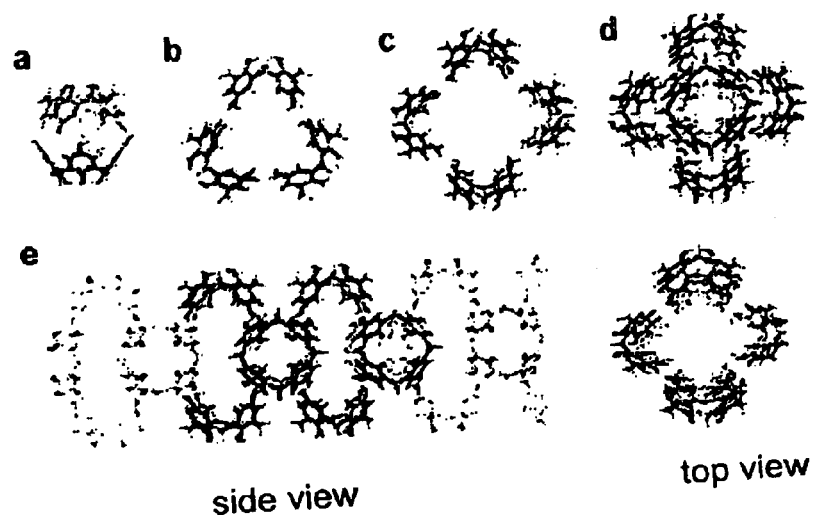
FIG. 1: schematic views of self-assembled structures of calix[4]hydroquinone (CHQ)

Various stages of self-assembled CHQ are shown in FIG. 1, wherein a represents a dimer; b, a trimer; c, a tetramer; d. an octahederal hexamer; and e, a tubular octamer.

The aqueous acetone solution used in the synthesis of the CHQ nanotube of the present invention is employed by mixing acetone and water which can dissolve CHQ, preferably in a 1:1 mixture by volume.

The self-assembling crystallization step may be conducted at a temperature ranging from 0° C. to room temperature. The crystallization temperature influences the aspect ratio of the crystal formed, e.g., a crystal having a high aspect ratio is formed at a lower temperature. Further, the crystallization mode is dependent on the rate of the acetone evaporation. For example, if acetone is allowed to evaporate slowly over several weeks, a nanotube crystal having a length of a few mm can be obtained, while if the acetone evaporating is carried out quickly within 2 or 3 days, fine crystals of 1 to 1,000 nm length are obtained.

The CHQ organic nanotube according to the present invention is obtained in the form of a single fiber or a bundle of fibers.

The CHQ organic nanotube of the present invention comprises an infinitely long one-dimensional hydrogen bond array composed of hydroxyl group of CHQ and water molecules, and it is possible to vary the framework of the CHQ nanotube by way of using CHQ derivatives having various functional groups.

The hydroqinone moiety of the nanotube functions as a powerful reducing agent and forms charge-transfer complexes with electron-deficient molecules and metal ions. For example, the CHQ nanotube can trap a large amount of a metal ion, e.g., $Ag^+$, within its channel. Therefore, the nanotube according to the present invention can be used in the synthesis of a nanowire. In recent years, ultrathin nanowires have attracted extensive interests because of their unusual quantum properties as well as of their potential use as nanoscale devices, wherein the key is to obtain a nanowire which have a small diameter, high-aspect-ratio and uniform orientation.

According to the present invention, a single-crystalline nanowire can be formed within the cavity or channel of the invented nanotube through a redox reaction between the hydroquinone moiety of the nanotube and metal ions trapped in the cavity. Specifically, the nanowire according to the present invention may be synthesized by placing the invented nanotube in an aqueous solution of a metal salt and allowing the metal ion to be reduced in the cavity of the nanotube used as a template. Such reduction may be carried out under an ambient condition over a period of approximately one day. This reduction process can be accelerated to within a few minutes when the reaction is carried out under UV having a wave length of 200–400 µm.

In the present invention, the metal salt used for synthesizing a nanowire may be a salt of any metal or combination of metals in any ratio which can be reduced by hydroquinone. For example, silver, gold, palladum, platinum and mercury having an oxidation potential of at least 0.7 V may be used as such a metal ion in consideration that the reduction potential of hydroquinone is 0.7 V. The water-soluble metal salt may be used in an excess equivalent amount relative to the amount of nanotube used.

According to the present invention, the nanowire could be grown uniformly to a length of 500 micron and to a width of 0.4 nm (the width of face-centered cubic (fcc) lattice constant.) Namely, since the nanotube template used to synthesize the nanowire of the present invention has a honeycomb structure made of ultrafine tubular arrays, nanowires formed therein are uniform in length and have a diameter as small as 0.4 nm which corresponds to the size of only 2 or 3 atoms put together. Such a nanowire material having a uniform dimension and electrochemical properties can be advantageously used in preparing such nanosize highly-integrated memory devices as quantum-well or quantum-wire.

Metal nanowires having a diameter of about 1 nm were prepared previously, but they were highly unstable, undergoing disintegration within 10 seconds in an ultra-high vacuum [see Kondo, Y. et al., "Synthesis and characterization of helical multi-shell gold wires", *Science* 289, 606–608 (2000) and Kondo, Y. et al., "Gold nanobride stabilized by surface structure, *Phys. Rev. Lett.* 79, 3455–3458 (1997).] In contrast, the nanowire synthesized according to the present invention is very stable under an ambient or aqueous environments. In addition, the nanowire of the present invention can be processed into a highly dense wire array ($3\times10^{13}$ wires/cm$^2$) which may be used advantageously in nano-electronic devices.

The following Examples are intended to further illustrate the present invention without limiting its scope; and the experimental methods used in the present invention can be practiced in accordance with Examples given herein below, unless otherwise stated.

EXAMPLE 1

Synthesis of Nanotubes 0.1 g of CHQ monomer was dissolved in 50 ml of 50% aqueous acetone at room temperature, and the resulting CHQ solution was kept at 4° C. for 4 weeks while allowing acetone to evaporate off, to obtain needle-like dark crystals. In an another run, a CHQ solution was prepared as above, cesium sulfate($Cs_2SO_4$) was added thereto in two equivalent amount based on the CHQ monomer used, and then kept at about 20° C. for 1 week while allowing acetone to evaporate off, to obtain the same needle-like dark crystals, which were isolated by filtering.

Figure 2:
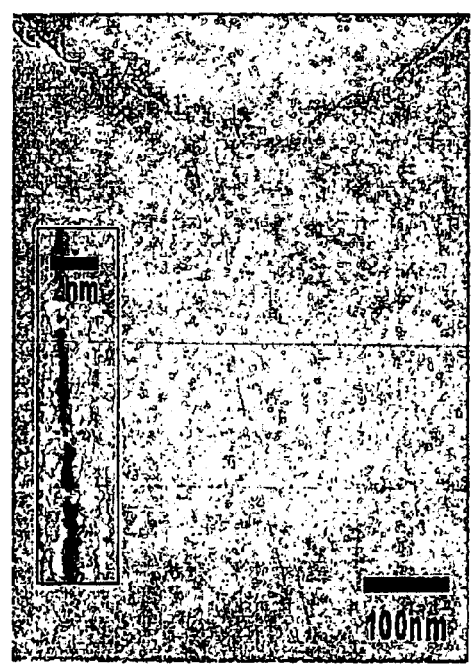
FIG. 2: an HRTEM (High resolution transmission electron microscope) image of the nanotube having a needle-like crystal form, obtained in accordance with one embodiment of the present invention.

The crystals thus obtained were self-assembled CHQ nanotube bundles having a paramagnetic property. The nanotube bundle obtained according to the present invention was analyzed with high-resolution transmission electron microscope (HRTEM), and the result reproduced in FIG. 2 shows a single channel nanotube having a width of 2 nm and a thin bundle (20 nm wide and 750 nm long).

Figure 3:
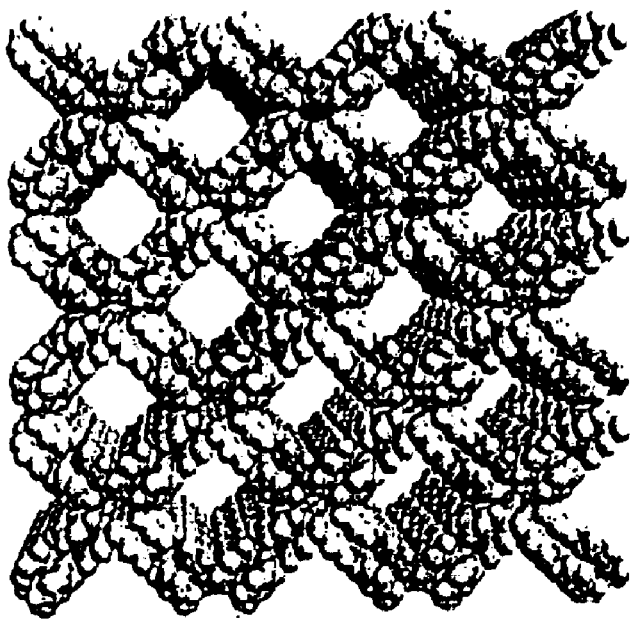
FIG. 3: schematic cross-sectional views of the nanotube and the nanowire prepared in accordance with one embodiment of the present invention, elucidated based on X-ray crystallography data.
Figure 3:
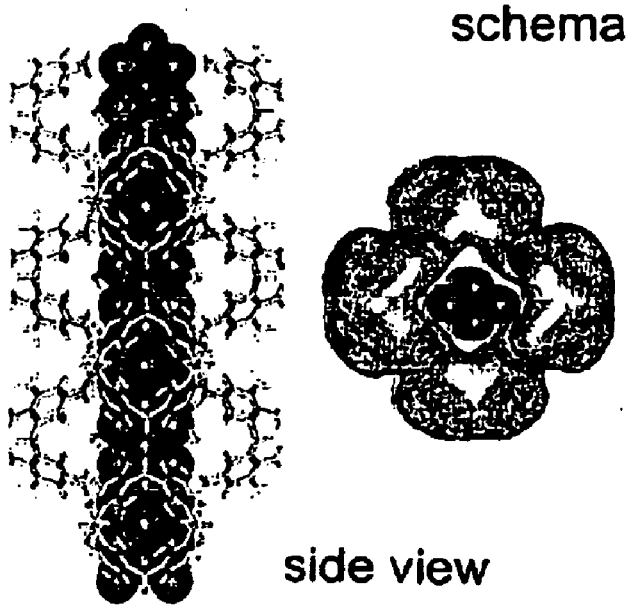

An X-ray crystalographic analysis revealed that the CHQ nanotube bundle thus obtained has the structure shown in FIG. 3; a honeycomb structure having a chessboard-like cross-section, each rectangular cell being of the size of 0.6×0.6 nm$^2$ and separated from the next cell by about 1.7 nm.

Figure 4A:
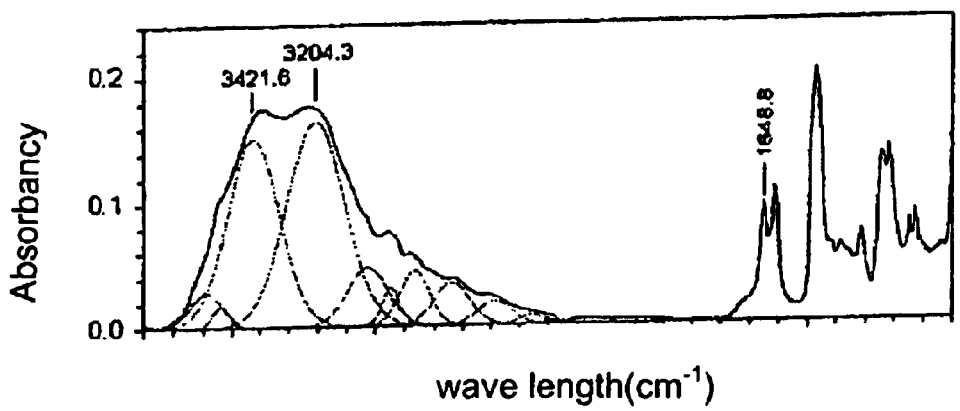
FIGS. 4a to 4c: FT-IR spectra of CHQ monomer, the invented nanotube held in a KBr pellet, and that suspended in an aqueous medium, respectively.
Figure 4B:
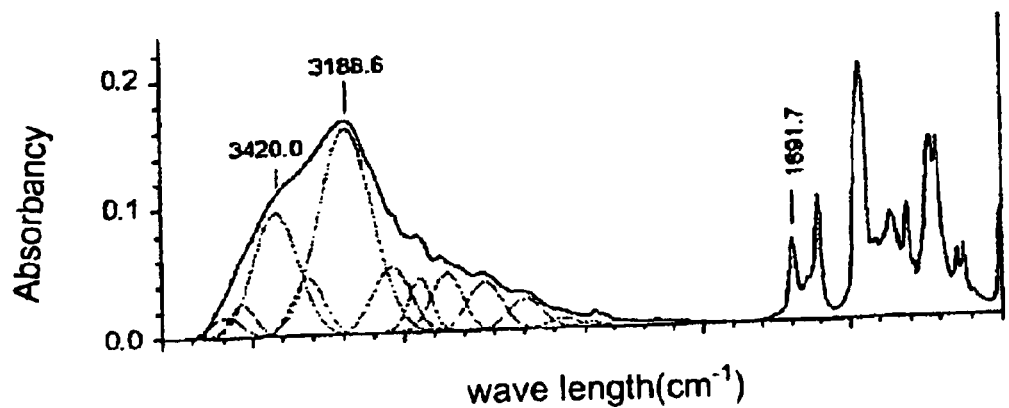
Figure 4C:
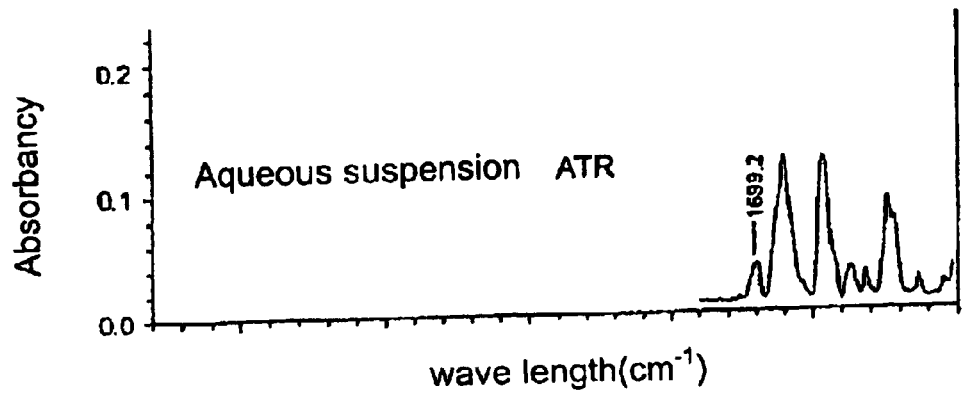

The CHQ nanotubes obtained above were also investigated with FT-IR spectroscopy. FIG. 4a is an FT-IR spectrum of CHQ monomer; FIG. 4b, the nanotube bundle held in a KBr pellet; and FIG. 4c, an aqueous suspension of the nanotube bundle. Analysis of FIGS. 4a to 4c reveals that the organic nanotube bundles of the present invention is capable of maintaining its structural integrity in an aqueous media, and it has an arrangement constructed based on short hydrogen bonds.

EXAMPLE 2

Synthesis of nanowires

The nanotube powder obtained in Example 1 was immersed under an ambient condition in a measured amount of 1M $AgNO_3$ so that the CHQ nanotube:$AgNO_3$ mole ratio became 1:4, followed by UV irradiation for 30 seconds to accelerate the redox process. The resulting product was filtered and rinsed with distilled water, to obtain a nanotube having a silver nanowire formed therein.

Various nanowires were synthesized similarly using $HAuCl_4$, $Hg_2SO_4$, $K_2PtCl_4$ and $PdCl_2$ in amounts corresponding to mole ratios of CHQ: $HAuCl_4$ 3:4, CHQ:$Hg_2SO_4$ 1:2, CHQ:$K_2PtCl_4$ 1:2 and CHQ:$PdCl_2$ 1:2, respectively.

Figure 5A:
FIGS. 5a and 5b: HRTEM images of nanotubes containing silver and gold nanowires, respectively.
Figure 5B:
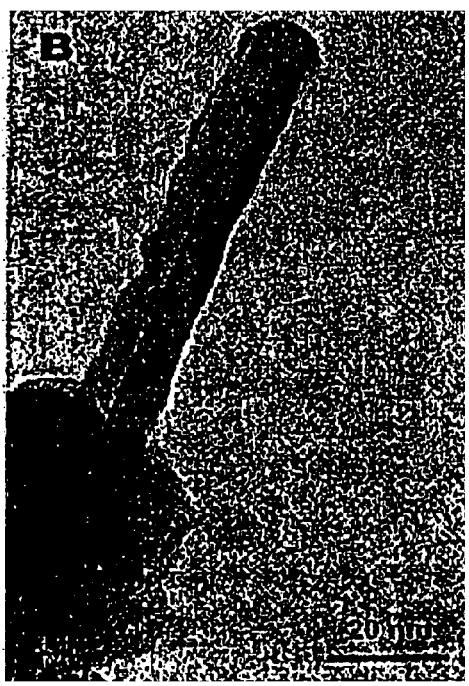

FIGS. 5a and 5b are HRTEM images of the nanotubes containing silver and gold nanowires formed within the nanotubes, respectively, wherein the dark lines in the tubes represent silver and gold nanowires, respectively.

Figure 6:
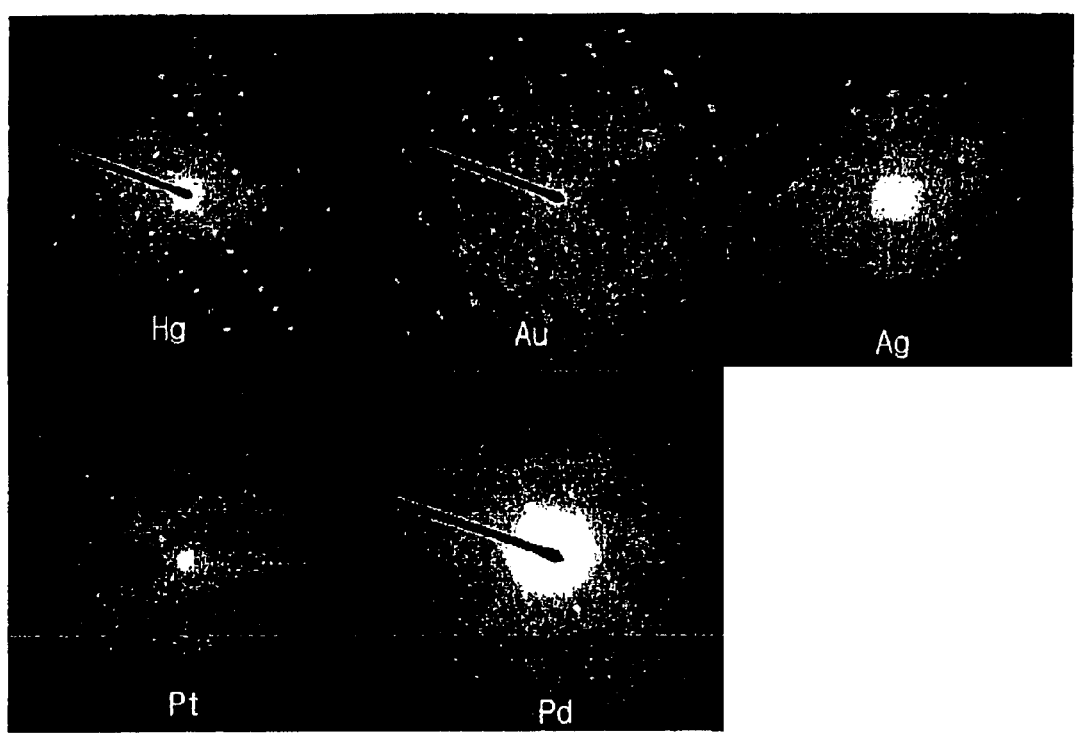
FIG. 6: one-dimensional electron diffraction patterns of nanowires obtained according to the present invention.

FIG. 6 shows one-dimensional electron diffraction patterns of five metal nanowires prepared according to the invented procedure using $Hg_2SO_4$, $HAuCl_4$, $AgNO_3$, $K_2PtCl_4$ and $PdCl_2$, respectively. The one-dimensional superlattice patterns shown in FIG. 6, which are intrinsic to ultrathin nanowires, demonstrate that various ultrathin nanowires can indeed be prepared in accordance with the present invention.

The above nanowires were confirmed to be made of respective elements by energy dispersive X-ray spectroscopy analysis, and they were found to be stable at room temperature for a month or longer.

While the embodiments of the subject invention have been described and illustrated, it is obvious that various changes and modifications can be made therein without departing from the spirit of the present invention which should be limited only by the scope of the appended claims.

What is claimed is:

1. A method for synthesizing a calix[4]hydroquinone (CHQ) organic nanotube, which comprises dissolving CHQ in an aqueous acetone solution, and allowing acetone to evaporate off the resulting solution at a temperature ranging from 0 to 20° C. to effectuate CHQ crystallization into a self-assembled nanotube.

2. The method of claim 1, wherein cesium sulfate ($Cs_2SO_2$) is added to the aqueous acetone solution as a crystallization promoter.

3. The method of claim 1, wherein the nanotube is in the form of a self-assembled tubular crystal.

4. A calix[4]hydroquinone(CHQ) organic nanotube synthesized by the method according to claim 1.

5. A method for synthesizing a nanowire, which comprises adding the calix[4]hydroquinone(CHQ) organic nanotube of claim 4 to an aqueous solution containing a metal salt to let the metal ion enter the cavity of the nanotube and allowing the metal ion to be reduced to form a nanowire.

6. The method of claim 5, wherein the metal salt is a salt of a metal having an oxidation potential of at least 0.7 V.

7. The method of claim 6, wherein the metal is selected from the group consisting of silver, gold, palladium, platinum and mercury.

8. The method of claim 5, wherein the reduction of the metal ion is carried out under UV irradiation.

* * * * *